United States Patent
Shibatani et al.

(10) Patent No.: US 7,936,797 B2
(45) Date of Patent: May 3, 2011

(54) LASER APPARATUS AND OUTPUT CONTROL METHOD OF LASER APPARATUS

(75) Inventors: Kazuhiro Shibatani, Sakai (JP); Dragan Pikula, Horseheads, NY (US); Vikram Bhatia, Painted Post, NY (US)

(73) Assignees: Konica Minolta Opto, Inc., Tokyo (JP); Corning Incorporated, Corning, NY (US)

( * ) Notice: Subject to any disclaimer, the term of this patent is extended or adjusted under 35 U.S.C. 154(b) by 0 days.

(21) Appl. No.: 12/643,195

(22) Filed: Dec. 21, 2009

(65) Prior Publication Data
US 2010/0166028 A1 Jul. 1, 2010

Related U.S. Application Data

(63) Continuation of application No. 12/079,042, filed on Mar. 24, 2009, now abandoned.

(30) Foreign Application Priority Data

Mar. 30, 2007 (JP) .................... 2007-091779

(51) Int. Cl.
*H01S 3/121* (2006.01)
*H01S 3/08* (2006.01)
*H01S 3/13* (2006.01)

(52) U.S. Cl. ............ 372/29.014; 372/14; 372/107
(58) Field of Classification Search .............. 372/14, 372/29.014, 107
See application file for complete search history.

(56) References Cited

U.S. PATENT DOCUMENTS
7,043,118 B2   5/2006   Arimoto et al.

FOREIGN PATENT DOCUMENTS
JP   06-265759   9/1994

*Primary Examiner* — Armando Rodriguez
(74) *Attorney, Agent, or Firm* — Brinks Hofer Gilson & Lione

(57) ABSTRACT

A laser apparatus includes: a laser light source; an output member for receiving and transmitting a laser light flux generated by the laser light flux, and outputting a laser light flux; an optical aligning member for positioning the laser light flux generated by the laser light source to the output member; a drive for driving the optical aligning member; a drive controller; an output detector for outputting a detected output representing an intensity of a laser light flux outputted from the output member; and an output controller. The drive controller controls the drive to drive the optical aligning member and the output controller changes a power of the laser light flux generated by the light source, based on the detected output.

17 Claims, 7 Drawing Sheets

LASER APPARATUS AND OUTPUT CONTROL METHOD OF LASER APPARATUS

This application is a continuation of prior U.S. application Ser. No. 12/079,042, filed Mar. 24, 2009 now abandoned, which is based on Japanese Patent Application No. 2007-091779, filed on Mar. 30, 2007, in the Japanese Patent Office, the entire contents of which are herein incorporated by reference.

TECHNICAL FIELD

The present invention relates to a laser apparatus and an output control method of a laser apparatus.

BACKGROUND

For example, U.S. Pat. No. 7,043,118 discloses a laser apparatus in which a projecting section of a laser oscillator emits a laser light flux and an optical member such as a lens aligns and guides the emitted laser light flux to a light-receiving member such as an optical fiber. It is known that an output of the laser apparatus of this kind results in Gaussian distribution for a misalignment of the laser light flux.

In the U.S. Pat. No. 7,043,118, the laser light flux is positioned on the optical fiber by the method that is called wobbling. According to the method, an optical member is oscillated minutely at a certain cycle and at certain amplitude, and a change of intensity of a laser light flux in optical fiber is measured. Thereby, a direction and an amount of movement of the optical member to maximize an intensity of the received laser light flux are calculated.

There is also known a control method called mountain-climbing control. According to the method, an optical member is moved by a prescribed amount in the laser apparatus of this kind, then, laser output is checked whether it increases or not. The optical member is moved repeatedly by a prescribed amount in the direction that output of the laser increases until the moment when the intensity of the received laser light flux starts decreasing.

In the aligning control of the laser apparatus described above, the laser output becomes a significant value which is not zero when the alignment is operated in a range of a diameter of, for example, about 1 µm. While, positioning resolution (minimum movement amount) of the optical member is about 100 nm, for example, with an actuator of a friction drive type employing a piezoelectric element.

In a conventional laser apparatus, therefore, it is difficult to position an optical member accurately at the location where the intensity of the received laser light flux becomes the maximum as shown in FIG. 7, for example. It causes aligning errors that a power of an actual outputted laser light flux becomes smaller than the maximum value, which has been a problem.

A laser apparatus used for optical communication is requested to keep a laser output to be constant. To comply with this, it is considered that the laser output is fed back to adjust an output of a laser oscillator. However, it cannot be used together with the alignment control based on the same laser output. Therefore, in the laser apparatus in which an output of the laser oscillator is controlled, even when the laser apparatus causes a misalignment due to manufacturing errors and secular changes, or to rise of temperatures in use, the laser apparatus is controlled so as to increase the laser output. Therefore, the energy efficiency of the laser apparatus decreases, which has been a problem.

SUMMARY

A laser apparatus relating to the present invention comprises: a laser light source for generating a laser light flux; an output member for receiving and transmitting the laser light flux generated by the laser light source, and outputting a laser light flux; and an optical aligning member for positioning the laser light flux generated by the laser light source to the output member. The laser apparatus further comprises: a drive for driving the optical aligning member; a drive controller for controlling the drive; an output detector for outputting a detected output representing an intensity of a laser light flux outputted from the output member; and an output controller for changing a power of the laser light flux generated by the light source. When the detected output is not larger than a predetermined threshold, the output controller sets the power of the laser light flux generated by the light source at a predetermined standard output, and the drive controller controls the drive to drive the optical aligning member so as to increase the detected output. When the detected output is larger than the predetermined threshold, the drive controller is stopped to statically position the optical aligning member, and the output controller controls the power of the laser light flux generated by the light source so that the detected output reaches to a predetermined target output.

A method relating to the present invention is a method of controlling an output of a laser apparatus in which a laser light flux emitted by a laser light source enters into an output member and a light flux outputted from the output member is emitted to an outside of the laser apparatus. The method comprises: detecting an intensity of the laser light flux outputted from the output member; changing relative positions of the output member and a laser light flux entering into the output member; and changing a power of the laser light flux emitted by the laser light source by changing an input signal to the laser light source. The method further comprises selecting one of the followings based on the intensity of the laser light flux outputted from the output member: the step of changing the relative positions of the output member and the laser light flux entering into the output member; and the step of changing the power of the laser light flux emitted by the laser light source.

A laser apparatus relating to the present invention comprises: a laser light source for generating a laser light flux with a different intensity corresponding to an input signal; an output member for receiving and transmitting the laser light flux generated by the laser light source, and outputting a laser light flux; and an optical aligning member for positioning the laser light flux generated by the laser light source to the output member. The laser apparatus further comprises: a drive for driving the optical aligning member; an output detector for outputting a detected output representing an intensity of a laser light flux outputted from the output member; and a controller for switching a drive control of the drive for driving the optical aligning member and an output control of the laser light source for changing the power of the laser light flux emitted from the laser light source, based on a signal from the output detector.

These and other objects, features and advantages according to the present invention will become more apparent upon reading of the following detailed description along with the accompanied drawings.

BRIEF DESCRIPTION OF THE DRAWINGS

Embodiments will now be described, by way of example only, with reference to the accompanying drawings which are meant to be exemplary, not limiting, and wherein like elements numbered alike in several Figures, in which.

DESCRIPTION OF THE PREFERRED EMBODIMENT

Figure 1:
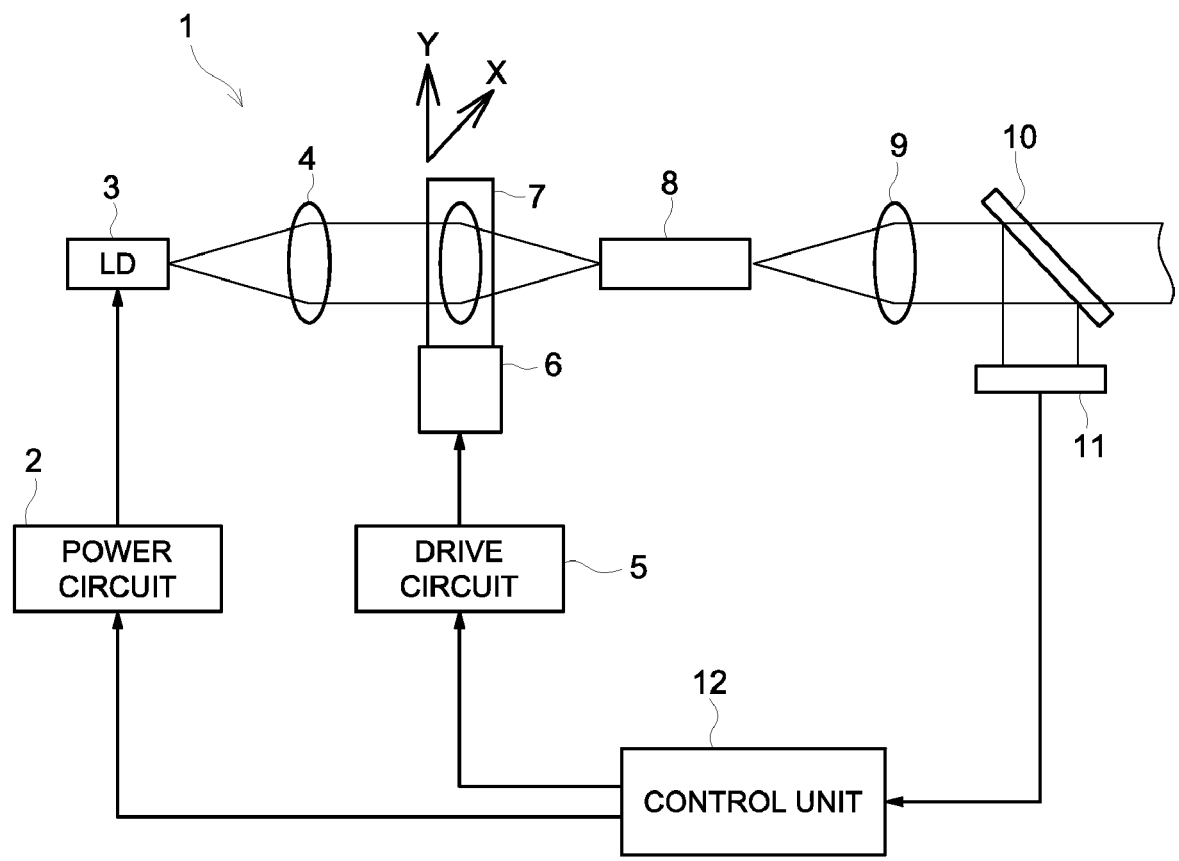
FIG. 1 is a schematic diagram of a laser apparatus in the first embodiment of the invention.

Embodiments of the invention will be explained as follows, referring to the drawings.

FIG. 1 shows laser apparatus 1 in the first embodiment of the invention. The laser apparatus 1 includes therein laser diode (laser light source) 3, projecting lens 4 positioned statically, aligning lens (optical aligning member) 7, second harmonic generating element (output member) 8 and output lens 9. The laser diode 3 converts electric power inputted from power circuit 2 and generates a laser light flux. The aligning lens 7 can be moved in two directions of X and Y perpendicular to the laser light flux by a drive apparatus (drive) to which the drive voltage is impressed from drive circuit 5. The laser light flux passing through the projecting lens 4 and the aligning lens 7 enters into the second harmonic generating element 8. The output lens 9 emits an outputted light flux of the second harmonic generating element 8. Further, the laser apparatus 1 includes therein beam splitter 10, power monitor (output detector) 11 and control unit 12. The beam splitter 10 branches a portion of the outputted light flux of the second harmonic generating element 8. The power monitor 11 converts intensity of the branched portion of the outputted light flux of the second harmonic generating element 8 into voltage signals (detected output). The control unit 12 controls operations of power circuit 2 and drive circuit 5 in accordance with detected output of power monitor 11.

The outputted light flux which has passed through the beam splitter 10 can be utilized for, for example, a scanning projector. An infrared laser light flux emitted from laser diode 3 is converted into a green light flux through the second harmonic generating element 8, and an optical path of the green light flux is merged with those of a red laser light flux and a blue laser light flux. Thereby, a color projected image is obtained with using a mirror deflecting the light fluxes in two dimensional direction and a projecting optical system.

The second harmonic generating element 8 has a light-receiving section with an aperture of about 1-3 μm. The aligning lens 7 converges a laser light flux so that it may become the same as the light-receiving section in terms of a diameter, and aligns an optical axis of the laser light flux to the center of the light-receiving section of the second harmonic generating element 8.

When the optical axis of the laser light flux is aligned to the center of the second harmonic generating element 8 by the aligning lens 7, all energy of the laser light flux is inputted in the second harmonic generating element 8. Therefore, an output of a second harmonic generating by the second harmonic generating element 8 becomes the maximum and the detected output of the power monitor 11 also becomes the maximum.

In the laser apparatus relating to the present invention, the drive apparatus 6 can be composed of a general linear actuator which positions the aligning lens 7 in directions perpendicular to the optical axis of the laser light flux.

Figure 2:
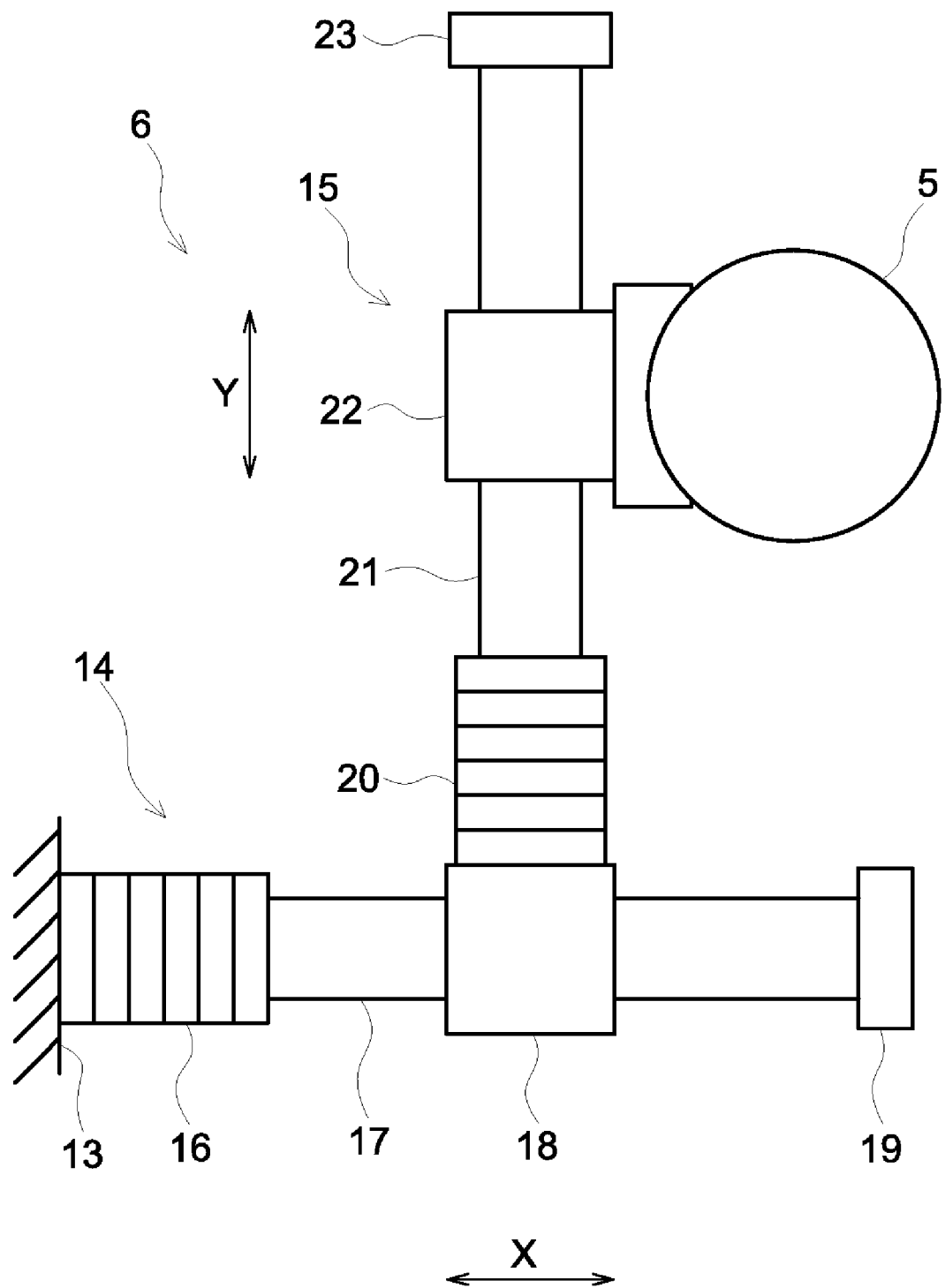
FIG. 2 is a schematic diagram of a drive apparatus of the laser apparatus in FIG. 1.

FIG. 2 shows a structure of drive apparatus 6 that moves the aligning lens 7. The drive apparatus 6 is composed of X-axis actuator 14 and Y-axis actuator 15. The X-axis actuator 14 is fixed on case 13. The Y-axis actuator 15 is moved by the X-axis actuator 14 in the X-axis direction and moves the aligning lens 7 in the Y-axis direction.

The X-axis actuator 14 is fixed on case 13 at its one end, and is composed of X-axis piezoelectric element 16, X-axis drive shaft 17, X-axis friction-engaging member 18 and X-axis stopper 19. The X-axis piezoelectric element 16 expands and contracts in the X-axis direction when it is impressed by voltage. The X-axis drive shaft 17 reciprocates in the X-axis direction when the X-axis piezoelectric element 16 expands and contracts. The X-axis friction-engaging member 18 engages with the X-axis drive shaft 17 through friction. The X-axis stopper 19 is provided on a tip of the X-axis drive shaft 17.

The Y-axis actuator 15 is fixed on the X-axis friction-engaging member 18 at its one end, and is composed of Y-axis piezoelectric element 20, Y-axis drive shaft 21, Y-axis friction-engaging member 22 and Y-axis stopper 23. The Y-axis piezoelectric element 20 expands and contracts in the Y-axis direction when it is impressed by voltage. The Y-axis drive shaft 21 reciprocates in the Y-axis direction when the Y-axis piezoelectric element 20 expands and contracts. The Y-axis friction-engaging member 22 engages with the Y-axis drive shaft 21 through friction. The Y-axis stopper 23 is provided on a tip of the Y-axis drive shaft 21, and the Y-axis friction-engaging member 22 supports the aligning lens 7. The X-axis friction-engaging member 18 can move within a range from the X-axis piezoelectric element 16 and the X-axis stopper 19, and the Y-axis friction-engaging member 22 can move within a range from the Y-axis piezoelectric element 20 and the Y-axis stopper 23.

Figure 3:
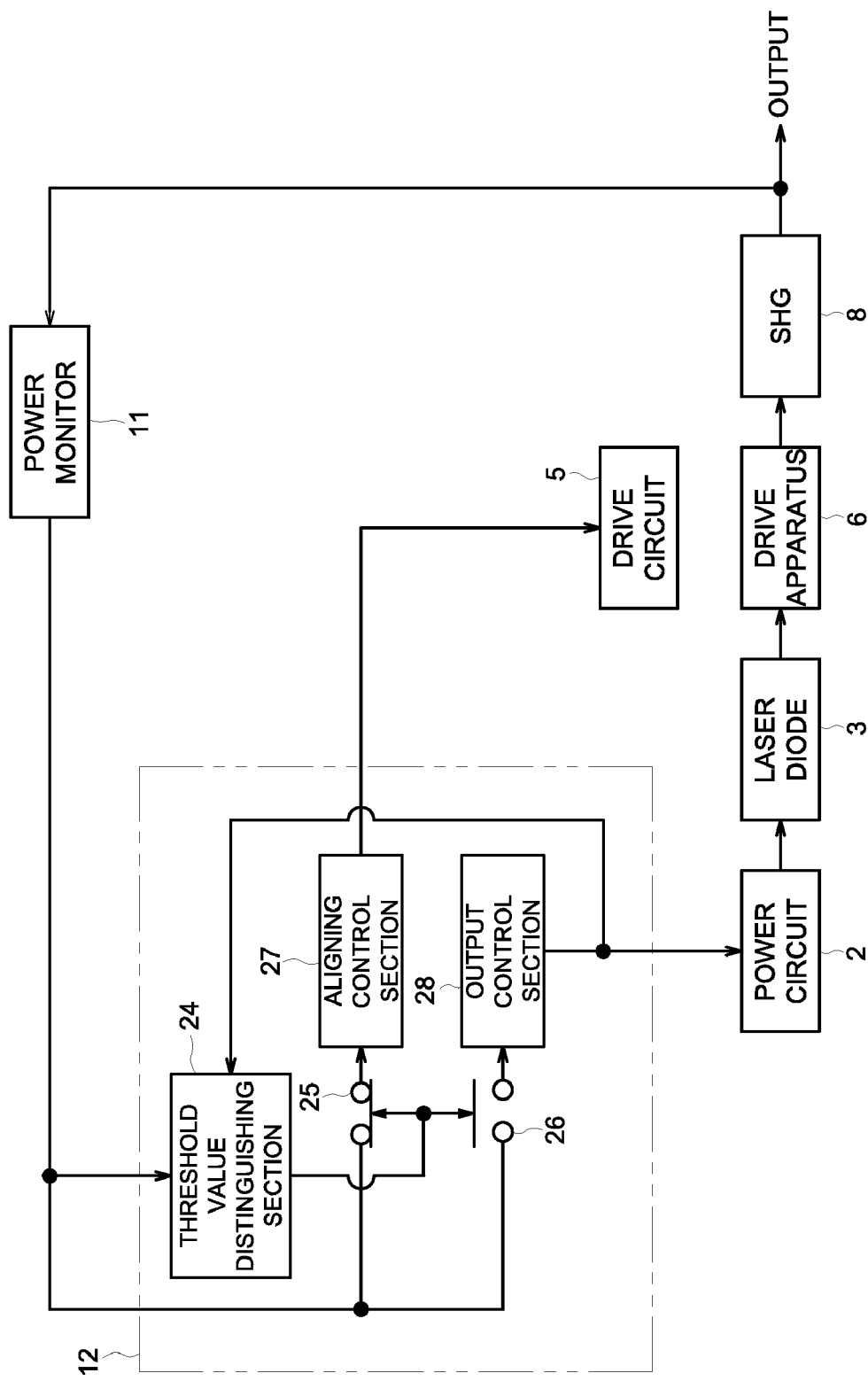
FIG. 3 is a block diagram showing the structure of the control unit in FIG. 1.

FIG. 3 shows a structure of control unit 12. The control unit 12 includes therein threshold value distinguishing section (distinguishing section) 24, and aligning control section (drive controller) 27 and output control section (output controller) 28. A detected output of the power monitor 11 is inputted to the threshold value distinguishing section 24. The detected output of the power monitor 11 is inputted to each of the aligning control section 27 and output control section 28 respectively through switch 25 and switch 26 controlled by threshold value distinguishing section 24. As a result of an action of switch 25 and an action of switch 26 which are opposite to each other, any one of the aligning control section 27 and output control section 28 outputs signal corresponding to detected output of power monitor 11.

For example, drive circuit 5 is a bridge circuit composed of a transistor impressing prescribed voltage respectively to X-axis piezoelectric element 16 and Y-axis piezoelectric element 20 of drive apparatus 6. Aligning control section 27 outputs signals for turning on or turning off of a transistor of drive circuit 5 in accordance with detected output of power monitor 11.

Power circuit 2 is, for example, a fixed voltage circuit that applies current with a predetermined current value to laser diode 3, and it normally outputs predetermined standard current. However, when output control section 28 applies voltage signals to the power circuit 2, the power circuit provides an output current which is offset from the standard current in proportion to the voltage signals.

Figure 4:
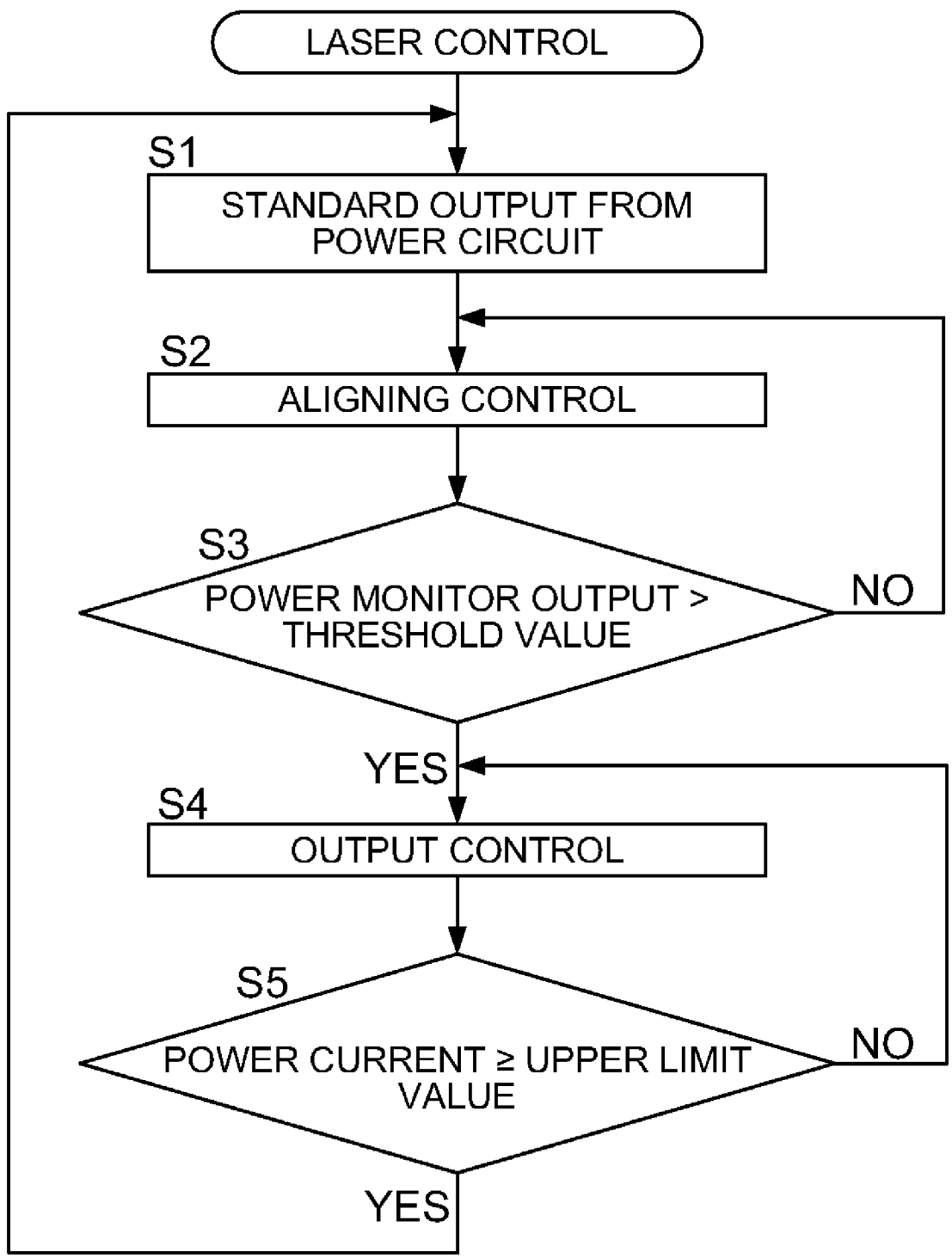
FIG. 4 is a flow chart of a control of the control unit in FIG. 3.

FIG. 4 shows a flow chart of a control in the control unit 12 relating to the present invention. First, when laser apparatus 1 starts output, threshold distinguishing section 24 turns switch 25 on and turns switch 26 off in step S1. Thereby, output of the output control section 28 disappears, and power circuit 2 outputs predetermined standard current to cause the laser diode 3 to generate a laser light flux with a predetermined power.

A laser light flux emitted from laser diode 3 is inputted in second harmonic generating element 8 through aligning lens 7, and the second harmonic generating element 8 emits an outputted light flux that is proportional to intensity of the inputted laser light flux. Power monitor 11 detects the intensity of the outputted light flux of the second harmonic generating element 8, and inputs it in threshold distinguishing section 24 and aligning control section 27 as detected output representing a voltage signal.

The aligning control section 27 conducts aligning control called wobbling to bring an optical axis of a laser light flux guided by aligning lens 7 close to the center of the second harmonic generating element 8 as followings (step S2). The aligning control section 27 detects changes of detected output by switching the drive circuit 5 so as to move the aligning lens 7 by a predetermined minute amount back and forth. Then, the aligning control section 27 switches drive circuit 5 so as to drive the aligning lens 7 by an amount obtained by multiplying a change of detected output by a predetermined coefficient.

Figure 5:
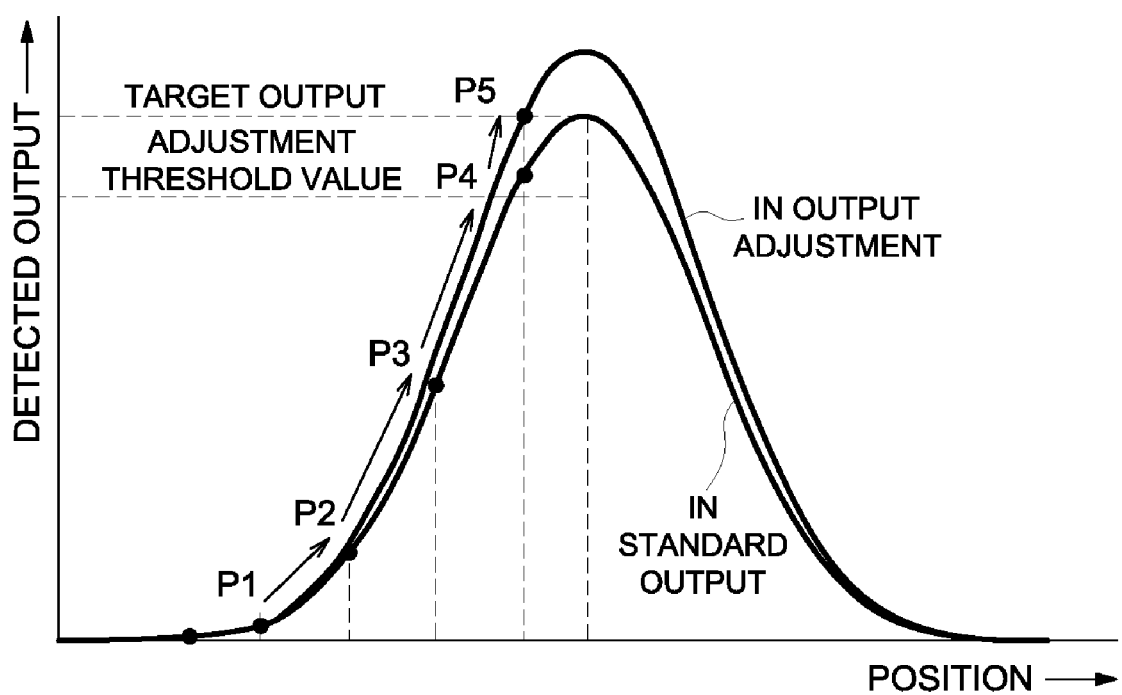
FIG. 5 is a diagram showing changes in detected output in positioning of the laser apparatus in FIG. 1.

For example, as shown in FIG. 5, the detected output is gradually enhanced by bringing the laser light flux close to the center of the second harmonic generating element 8 in order of points P1, P2, P3, and P4.

Threshold value distinguishing section 24 confirms detected output of power monitor 11 in step S3 each time the aligning control section 27 conducts wobbling in step S2, in FIG. 4. When the detected output is not higher than a predetermined adjustment threshold value, the threshold value distinguishing section 24 keeps switch 25 turned on and switch 26 turned off. Thereby, aligning control by the aligning control section 27 in step S2 is repeated.

When the detected output exceeds a predetermined adjustment threshold value in step S3, the threshold value distinguishing section 24 turns switch 25 off to statically position the aligning lens 7 by stopping operations of the aligning control section 27, and turns switch 26 on to increase and reduce output of the power circuit 2 (from point P4 to P5 in FIG. 5) with output control section 28 so that the detected output may agree with a predetermined target output (step S4).

As described above, an optical aligning member aligns a laser light flux to reduce a loss of the laser light flux caused by misalignment, and output control adjusts just a slight error in output remaining within a range close to the limitation of positioning accuracy of the optical aligning member, whereby a constant amount of output is obtained. Therefore, it exhibits a high energy-efficiency. Further it can cope with both of misalignment of a laser light flux in the laser apparatus and property change of a laser light source, which further exhibits a high reliability.

In step S5, the threshold value distinguishing section 24 monitors an output of the output control section 28, namely, a predetermined value of output current (electric power) of power circuit 2 to be inputted in laser diode 3. If an output of the output control section 28 does not apply input current (input signal) with a current value that is the predetermined upper limit value or higher to laser diode 3, the threshold value distinguishing section 24 makes the output control section 28 continue the output control with keeping the switch 25 turned off and keeping the switch 26 turned on as they are.

However, when an output of the output control section 28 reaches to apply an input current with the current value that is the predetermined upper limit value or higher to laser diode 3, the threshold value distinguishing section 24 turns switch 25 on and turns switch 26 off again. Owing to this, the flow returns to step S1. The output of power circuit 2 returns to the standard current, then, the aligning control section 27 controls drive circuit 5, and a laser light flux is aligned by a movement of the aligning lens 7 due to drive apparatus 6.

When elongations of respective members caused by temperature rise in use, relative position between members or optical properties changes. It causes a situation such as misalignment of the laser light flux from second harmonic generating element 8. Thereby, the rise of an output of the output control section 28 as described above can be caused. Namely, the threshold value distinguishing section 24 monitors the positional misalignment of a laser light flux by monitoring input electric power of laser diode 3.

When the output of power circuit 2 returns to the standard current, power of the light flux emitted from the laser diode 3 decreases. However, it does not cause substantial problem in actual use when the aligning lens 7 re-aligns a light flux within a range such that, in a example of a scanning projector, the outputted light flux which returns from the end position to the start position of the scanning of the projected image does not enters into a projecting optical system.

Further, the threshold value distinguishing section 24 of the above embodiment monitors an input signal from output control unit 28 to power circuit 2. Alternatively, the threshold value distinguishing section 24 can detect and monitor an input current (input signal) from power circuit 2 to laser diode 3, or a power (intensity) of an outputted light flux of the laser diode 3.

According to the structure, misalignment caused by a rise of temperature in use is detected by a rise of electric power inputted to a laser light source, and the optical aligning member is driven again for the alignment, whereby, high energy efficiency can be assured constantly.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

Figure 6:
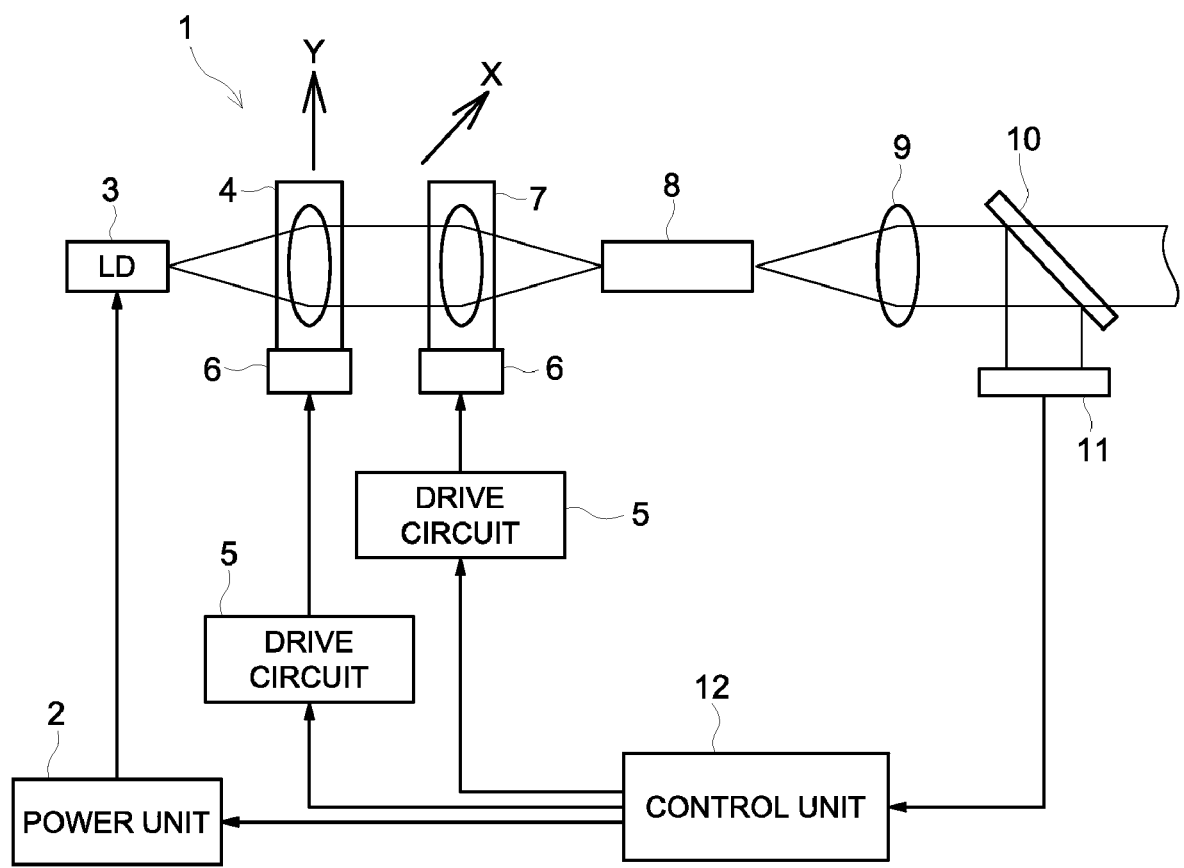
FIG. 6 is a schematic diagram of a laser apparatus in the second embodiment of the invention.
Figure 7:
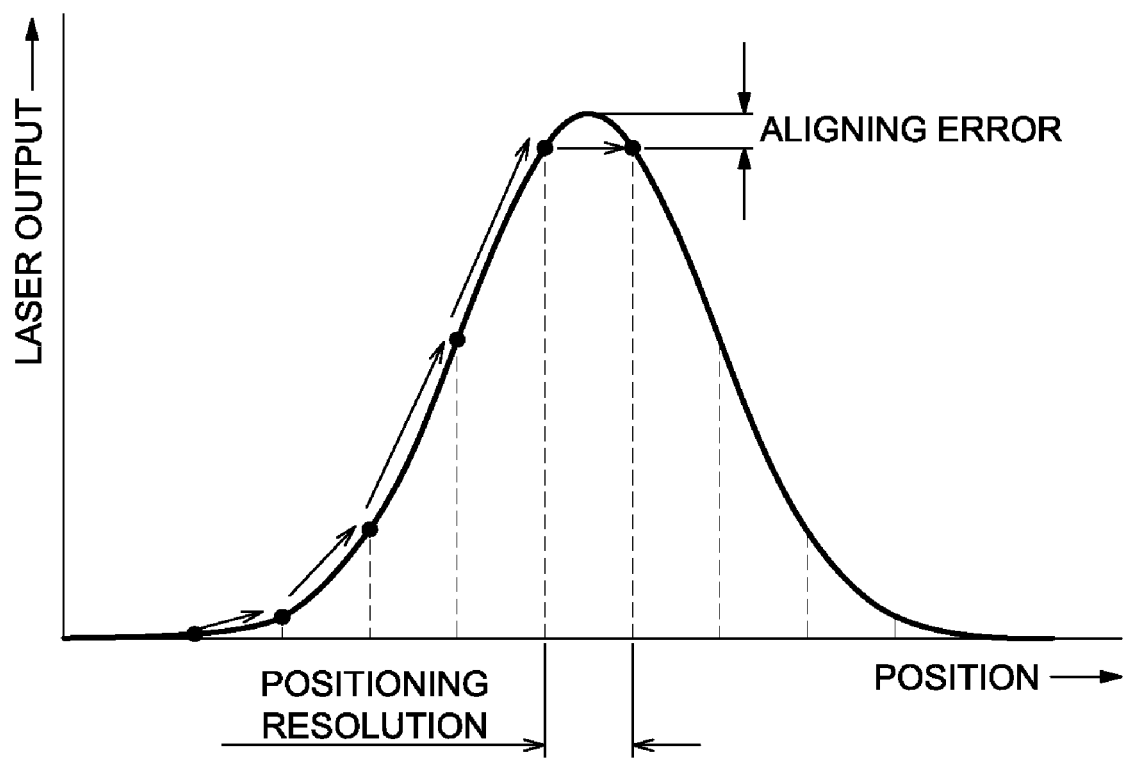
FIG. 7 is a diagram showing changes in detected output in a conventional laser apparatus.

As in the second embodiment shown in FIG. 6, the laser apparatus alternatively can provide projecting lens 4 capable of being driven to move in the Y-axis direction as a first moving member and to provide aligning lens 7 capable of moving in the X-axis direction as a second moving member.

Further, the laser apparatus relating to the present invention can also be applied to a laser apparatus movable on only one axis and to a laser apparatus that can be positioned on three axes or more, without being limited to the aforesaid embodiment.

Further, the laser apparatus relating to the present invention can also employ a known control process which drives an optical aligning member so as to make the detected output maximum, for example, mountain-climbing control, in place of the wobbling.

What is claimed is:
1. A laser apparatus comprising:
a laser light source for generating a laser light flux;
an output member for receiving and transmitting the laser light flux generated by the laser light source, and outputting a laser light flux;

an optical aligning member for positioning the laser light flux generated by the laser light source to the output member;
a drive for driving the optical aligning member;
a drive controller for controlling the drive;
an output detector for outputting a detected output representing an intensity of a laser light flux outputted from the output member; and
an output controller for changing a power of the laser light flux generated by the light source,
wherein when the detected output is not larger than a predetermined threshold, the output controller sets the power of the laser light flux generated by the light source at a predetermined standard output, and the drive controller controls the drive to drive the optical aligning member so as to increase the detected output, and
wherein when the detected output is larger than the predetermined threshold, the drive controller is stopped to statically position the optical aligning member, and the output controller controls the power of the laser light flux generated by the light source so that the detected output reaches to a predetermined target output.

2. The laser apparatus of claim 1,
wherein the drive comprises an actuator for positioning the optical aligning member along a direction perpendicular to an optical axis of the laser light flux.

3. The laser apparatus of claim 1, further comprising a distinguishing section for monitoring an electric power applied to the laser light source, and
when the electric power becomes a predetermined upper limit value or higher, the output controller sets the power of the laser light flux generated by the light source at the predetermined standard output, and the drive controller further controls the drive to drive the optical aligning member so as to increase the detected output.

4. The laser apparatus of claim 3,
wherein the drive comprises an actuator for positioning the optical aligning member along a direction perpendicular to an optical axis of the laser light flux.

5. The laser apparatus of claim 1,
wherein the output member is a second harmonic generating element, and the laser light flux outputted from the output member is a second harmonic of the laser light flux generated by the laser light source.

6. A method of controlling an output of a laser apparatus in which a laser light flux outputted by a laser light source enters into an output member and a laser light flux outputted from the output member is emitted to an outside of the laser apparatus, the method comprising:
detecting an intensity of the laser light flux outputted from the output member;
changing relative positions of the output member and a laser light flux entering into the output member;
changing a power of the laser light flux emitted by the laser light source by changing an input signal to the laser light source; and
selecting one of
the step of changing the relative positions of the output member and the laser light flux entering into the output member and
the step of changing the power of the laser light flux emitted by the laser light source,
based on the intensity of the laser light flux outputted from the output member.

7. The method of claim 6,
wherein when the intensity of the laser light flux outputted from the output member is not larger than a predetermined threshold,
the power of the laser light flux emitted by the laser light source is fixed, and the relative positions of the output member and the laser light flux entering into the output member is changed so as to increase the laser light flux outputted from the output member.

8. The method of claim 6,
wherein when the intensity of the laser light flux outputted from the output member is larger than a predetermined threshold, the relative positions of the output member and the laser light flux entering into the output member is fixed, and the power of the laser light flux is increased so that the power of the laser light flux outputted from the output member becomes a predetermined value.

9. The method of claim 6,
wherein when the intensity of the laser light flux outputted from the output member is not larger than a predetermined threshold,
the power of the laser light flux emitted by the laser light source is fixed, and the relative positions of the output member and the laser light flux entering into the output member is changed so as to increase the laser light flux outputted from the output member, and
wherein when the intensity of the laser light flux outputted from the output member is larger than a predetermined threshold, the relative positions of the output member and the laser light flux entering into the output member is fixed, and the power of the laser light flux is increased so that the power of the laser light flux outputted from the output member becomes a predetermined value.

10. The method of claim 9, further comprising:
monitoring the power of the laser light flux outputted from the light source,
wherein when the power of the laser light flux outputted from the light source becomes a predetermined threshold or higher, the power of the laser light flux outputted from the light source is decreased to a predetermined standard value, and the relative positions of the output member and the laser light flux entering into the output member is changed so as to increase the laser light flux outputted from the output member.

11. The method of claim 10,
wherein in the step of monitoring the power of the laser light flux outputted from the light source, an input signal for controlling the power of the laser light flux outputted from the light source is monitored.

12. The method of claim 10,
wherein in the step of monitoring the power of the laser light flux outputted from the light source, an intensity of the laser light flux outputted from the laser light source is monitored.

13. The method of claim 10,
wherein in the step of changing the relative positions of the output member and the laser light flux entering into the output member,
a laser light flux is positioned to the output member by moving an optical aligning member arranged between the laser light source and the output member.

14. The method of claim 13,
wherein the optical aligning member moves in a direction perpendicular to an optical axis of the laser light flux entering into the output member.

15. The method of claim 6,
wherein the output member is a second harmonic generating element, and the laser light flux outputted from the output member is a second harmonic of the laser light flux generated by the laser light source.

16. A laser apparatus comprising:
a laser light source for generating a laser light flux with a different intensity corresponding to an input signal;
an output member for receiving and transmitting the laser light flux generated by the laser light source, and outputting a laser light flux;
an optical aligning member for positioning the laser light flux generated by the laser light source to the output member;
a drive for driving the optical aligning member;
an output detector for outputting a detected output representing an intensity of a laser light flux outputted from the output member; and
a controller for switching a drive control of the drive for driving the optical aligning member and an output control of the laser light source for changing the power of the laser light flux emitted from the laser light source, based on a signal from the output detector.

17. The laser apparatus of claim 16,
wherein the output member is a second harmonic generating element, and the laser light flux outputted from the output member is a second harmonic of the laser light flux generated by the laser light source.

* * * * *